United States Patent [19]

Goronkin

[11] 3,905,036

[45] Sept. 9, 1975

[54] FIELD EFFECT TRANSISTOR DEVICES AND METHODS OF MAKING SAME

[75] Inventor: Herbert Goronkin, Dewitt, N.Y.

[73] Assignee: General Electric Company, Schenectady, N.Y.

[22] Filed: Mar. 29, 1974

[21] Appl. No.: 455,974

[52] U.S. Cl. ....................... 357/22; 357/55; 357/56; 357/41

[51] Int. Cl.[2] .................... H01L 29/80; H01L 29/06

[58] Field of Search .................... 357/22, 55, 56, 41

[56] References Cited

UNITED STATES PATENTS

| | | | |
|---|---|---|---|
| 3,761,785 | 9/1973 | Pruniaux | 357/22 |
| 3,801,391 | 4/1974 | Dyment et al. | 357/56 |
| 3,823,352 | 7/1974 | Pruniaux et al. | 357/22 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

Relates to JFET field effect transistor devices formed in a substrate including a first and third layers of low resistivity adjacent opposed major surfaces of the substrate and a second intermediate layer of high resistivity. The third layer is provided with an opening exposing the second layer. A mesa or projection is epitaxially grown in the opening from the second and third layers. By proper provision of the conductivity type in the three layers and the projection, the projection may constitute either the source or gate region, and correspondingly the third layer would constitute the gate or source region. The first layer constitutes the drain region.

7 Claims, 9 Drawing Figures

FIELD EFFECT TRANSISTOR DEVICES AND METHODS OF MAKING SAME

The present invention relates to field effect transistor devices of the JFET (junction field effect transistor) variety and to methods of making such devices.

Present JFET devices for operation above one giga-Hertz require several ultra-high resolution fabrication masks which must be mutually registered with tolerances approaching small fractions of a micron. For fabricating such devices to provide high power (several watts) such tolerances must be maintained over semiconductor chip sizes of the order of 100 × 100 mils and to obtain reasonable chip yields such tolerances must be held across an entire wafer.

The present invention is directed to the provision of field effect transistor devices of the kind described above of improved structure which can be simply and economically fabricated.

An object of the present invention is to provide a process for making JFET semiconductor devices in which the active regions thereof are self-aligned and in which only a single small geometry mask is required in the fabrication thereof.

Another object is to provide JFET semiconductor devices of compact structure.

Still another object is to provide JFET semiconductor devices which utilize a minimum of active semiconductor material with resultant minimization of power loss therein.

Still another object of the present invention is to provide JFET semiconductor devices in which the need for cross-over lines interconnecting like electrodes is avoided.

A further object of the present invention is to provide JFET semiconductor devices adapted for high gate-to-drain operating voltages.

In accordance with one illustrative embodiment of the invention there is provided a body of semiconductor material including a first layer of a first conductivity type and of low resistivity, a second layer of said first conductivity type and of high resistivity overlying said first layer, and a third layer of conductivity type opposite to said first conductivity type and of low resistivity overlying said second layer. The third layer includes an outwardly extending major surface and has an elongated opening exposing an elongated region of the second layer. A projection of semiconductor material of the first conductivity type is epitaxially grown on the exposed region of the second layer and in the opening of the third layer. The projection extends outward from the exposed surface of the third layer for a predetermined distance and thereafter extends substantially parallel to the exposed surface of the third layer to provide portions overhanging the elongated edges of the opening in the third layer. The projection includes a first portion initially formed of intermediate resistivity adjacent to the second and third layers, and a second portion subsequently formed of low resistivity remote from the first and second layers. Each of the exposed portions of the third layer and the projection are provided with a respective conductive layer. The second portion of the projection constitutes a source region, the first layer of the body constitutes a drain region and the third layer constitutes a gate region.

In accordance with another aspect of the present invention there is provided a body of semiconductor material including a first layer of a first conductivity type and of low resistivity, a second layer of the first conductivity type and of high resistivity overlying the first layer, and a third layer of a second conductivity type opposite to the first conductivity type and of low resistivity overlying the second layer. An insulating layer is formed over the exposed surface of the third layer. An elongated opening is formed in the insulating layer exposing a selected elongated portion of the third layer. An elongated opening is also formed in the selected elongated portion of said third layer to expose a selected elongated region of the second layer. Semiconductor material of the first conductivity type is epitaxially grown from the exposed portions of the second and third layers outward from the major surface of the body of semiconductor material to form a projection which extends to and over the exposed surface of the insulating layer. The lateral extension of the projection over the major surface is substantially uniform and of sufficient extend to overlie the PN junctions formed between the second and third layers. The insulating layer is then removed. Each of the exposed portions of the third layer and the outwardly extending exposed surface of the projection is provided with a respective conductive layer.

The novel features which are believed to be characteristic of the present invention are set forth with particularly in the appended claims. The invention itself, both as to its organization and method of operation, together with further objects and advantages thereof may best be understood by reference to the following description taken in connection with the accompanying drawings wherein FIG. 1 is a plan view of a field effect semiconductor device in accordance with the present invention.

Figure 1:
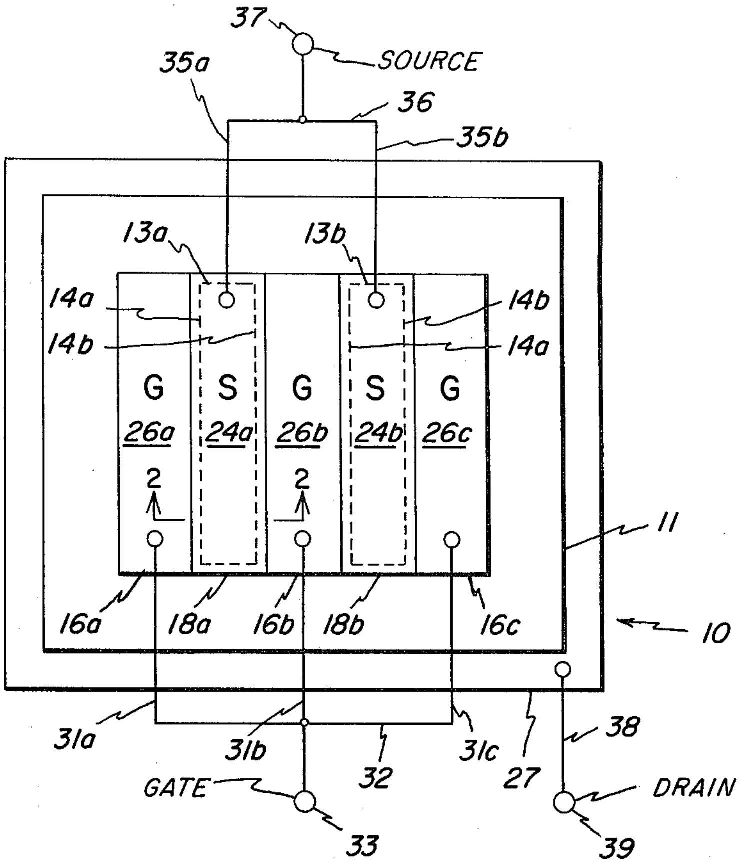
Figure 2:
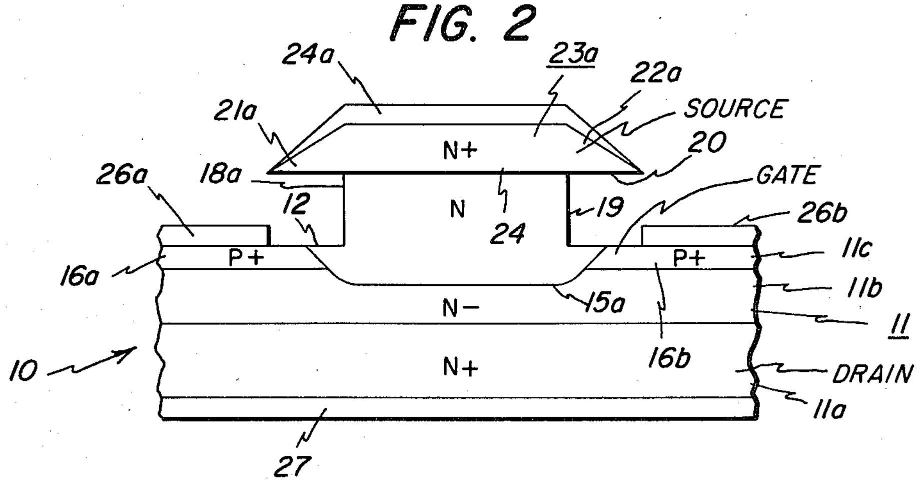
FIG. 2 is a sectional view of the device of FIG. 1 taken along section lines 2—2 showing the internal construction thereof.

Reference is now made to FIGS. 1 and 2 which show a field effect transistor 10 in accordance with the present invention. The device 10 is formed on a substrate 11 of monocrystalline silicon semiconductor material. The substrate includes a first layer 11*a* of N-type conductivity of low resistivity, for example, 0.01 ohm-cm and a thickness of 10 mils, and also includes a second layer 11*b* of N-type conductivity, which may be epitaxially grown thereon, of high resistivity, for example, 10 ohm-centimeters, and having a thickness of the order of 5 microns. Into the exposed major surface of the epitaxial layer acceptor activators are diffused to form a third layer 11*c* of P-type conductivity, low resistivity and having a thickness of about 1 micron. On the major surface 12 of the substrate 11, and in particular on the exposed surface of the diffused layer 11*c*, are provided a plurality of elongated surface regions 13*a* and 13*b*, each of identical form and each including a pair of long edges 14*a* and 14*b* equally spaced along the length thereof. The elongated regions 13*a*–13*b* are uniformly spaced side by side along the major surface 12 of the substrate. The elongated surface regions are delineated by initially providing a thin, for example 1 micron thick, silicon oxide layer on the major surface 12 and etching a fine geometry pattern of elongated openings therein using conventional photolithographic masking and etching techniques. A suitable silicon etchant is then utilized to etch the third or diffused layer and expose the second or epitaxial layer. The exposed elongated regions of the epitaxial layer 11*b* such as region 15*a* is then cleaned and a plurality of mesas or projections 18*a* and 18*b* of N-type conductivity and moderate or intermediate resistivity are epitaxially grown on the exposed epitaxial layer and in the elongated openings in the third or diffused layer. The projections extend outward from the exposed surface of the diffused or third layer for a predetermined distance 19 and thereafter extends a comparable distance 20 parallel to the major surface of the substrate to provide portions 21*a* and 22*a* which overhang the elongated edges of the elongated openings provided in the third layer 11*c*. A donor activator such as arsenic or antimony is diffused into the top portions of the projections to provide more heavily doped N-type conductivity and low resistivity. The top portions such as 23*a*, extend to the plane indicated by line 24. Thereafter the exposed portions of the elongated regions 16*a*, 16*b* and 16*c* of P-type conductivity formed in the third layer by etching along the opening therein and the outward extending faces of the projections 18 and 18*b* are provided with metallization to form the conductive electrodes thereof. In the metallization process, the substrate is disposed with respect to the source of metallization so that essentially line of sight metallization occurs with the overhanging portions of the projections providing a shadow mask with respect to certain portions of the elongated regions formed in third or diffused layer by etching elongated openings in the third layer, thus simplifying the application of the metallized electrodes to the device. A double metallization layer is provided. An initial layer of titanium is evaporated on the device. A layer of molybdenum is then deposited on the titanium layer. In this device the N+ top portions of the projections constitute the source electrodes of the device, the elongated P+ diffused regions constitute the gate electrodes of the device, and the N+ layer of the substrate constituting the drain electrode of the device. A metal electrode 27 of molybdenum may be applied to the exposed surface of the N+ drain layer 11*a*. The conductive layers formed on the source regions are denoted 24*a* and 24*b*. The conductive layers formed on the gate regions 16*a*–16*c* are denoted 26*a*–26*c*, respectively.

Conductive connection to each of the gate electrodes 26*a*–26*c* is made by means of vertical leads 31*a*–31*c*, respectively, which in turn are connected to a horizontal lead 32 and to a gate terminal 33. Conductive connection is made to each of the source electrodes 24*a* and 24*b* by means of vertical leads 35*a* and 35*b* respectively, which in turn are connected to a horizontal source lead 36 and to a source terminal 37. Lead line 38 makes conductive connection between the drain electrode 27 and drain terminal 39.

For reasons of simplicity in illustrating and describing the field effect transistor of FIGS. 1 and 2 the final glassification and overlying metallization has not been shown but has been indicated schematically by the manner of connection of the leads to the various electrodes of the device. The device of FIGS. 1 and 2 may be covered with glass, for example, chemical vapor deposited glass, to completely enclose the electrodes in glass. Thereafter two rows of holes may be provided in the glass, one row exposing the source electrodes and the other exposing the gate electrodes. Thereafter a pair of metallized stripes may be provided over the glass enclosed structure to make the electrical connections illustrated in FIG. 1. The horizontal gate lead 32 would be formed by one stripe of metallization overlying the device, each of the vertical gate leads 31*a*–31*c* would correspond to metallization extending through holes in the glass enclosure to the gate electrodes. Similarly, the horizontal source lead 36 would represent another stripe of metallization over the glass and the vertical source leads 35*a* and 35*b* would represent the metallization extending through the holes in the glass to the source electrodes.

A device such as described in FIGS. 1 and 2 in which the lateral spacing of the elongated edges 14*a* and 14*b* of the elongated surface region is approximately 0.1 mil, the separation of the N+ source region 23*a* and the N+ drain region 11*a* is about 0.3 mils would be suitable for operation at frequencies in the range of 1–6 giga-Hertz.

Figure 3A:
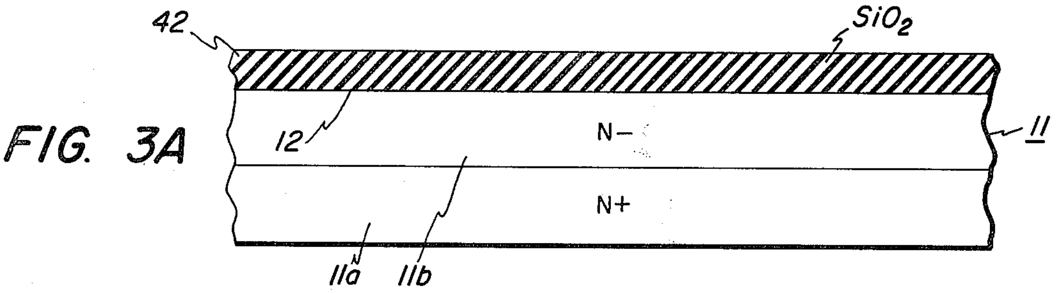
FIGS. 3A through 3E are cross-sectional views of a portion of the semiconductor device, such as shown in FIG. 2, illustrating the steps in the fabrication of the device in accordance with the present invention.

Reference is now made to FIGS. 3A through 3E which illustrate the manner of fabrication of the field effect transistor device 10 of FIGS. 1 and 2. Initially a wafer or substrate 11 of monocrystalline silicon semiconductor material having a low resistivity N-type conductivity first layer 11*a* about 10 mils thick and an epitaxially grown second layer 11*b* of N-type conductivity and high resistivity thereon about 5 microns thick is provided as shown in FIG. 3A. The resistivity of the layer 11*a* may be the order of 0.1 ohm-cm and the resistivity of the second layer 11*b* may be of the order of 1 ohm-cm. Preferably the substrate is formed so that the exposed surface of the epitaxial layer has a crystallographic orientation lying in the <100> plane of crystal structure thereof. The substrate is then provided with a layer 42 of thermally grown oxide of sufficient thickness to function as a diffusion mask for P-type activators such as boron and may be of the order of 0.3 microns thick as shown in FIG. 3A.

Figure 3B:
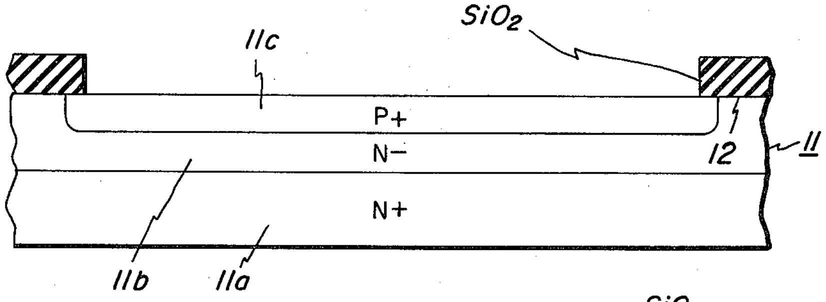

As shown in FIG. 3B, a large area in the oxide 42 is opened and acceptor activators are diffused into the layer from a suitable source. The source may be a layer of glass including the activator such as boron in the form of an oxide thereof. The activators are diffused into the layer to a depth of about 1 to 1.5 microns and are provided in sufficient concentration to render the diffused layer heavily P-type in conductivity.

Figure 3C:
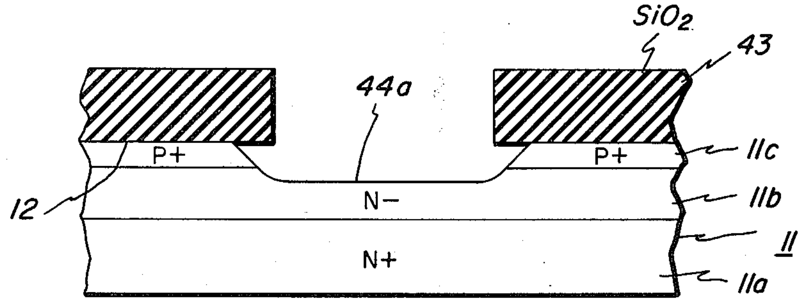

The silicon dioxide is then stripped and an other layer 43 of silicon dioxide is deposited thereon about 1 micron thick as shown in FIG. 3C. An etch mask of suitably developed or formed photoresist is provided on the oxide in which elongated openings are provided therein in registry with the elongated surface regions 13*a* and 13*b* in the major surface 12 of the substrate 11 of the device 10 of FIGS. 1 and 2. The substrate with oxide and etched mask thereon is then subjected to a suitable oxide etch consisting of a 10% solution of hydrofluoric acid to etch openings in the oxide. The exposed third or diffused layer is then subjected to a preferential etch consisting of 14% potassium hydroxide, 40% isopropyl alcohol, and the remainder water to etch elongated openings 44*a* and 44*b* through the third or diffused layer 11*c* to expose elongated portions 45*a* and 45*b* of the epitaxial layer 11*b*. The selection of major surface parallel to <100> plane of the substrate and the utilization of the aforementioned etch provides steep sides to the elongated openings 44*a*–44*b* making approximately an angle of 55° to the plane of the major surface 12. After suitable cleaning of exposed portions of the second layer, the substrate is ready for epitaxial growth of the mesas or projections thereon. The process that is used for this purpose involves the hydrogen reduction of silicon tetrachloride.

Figure 3D:
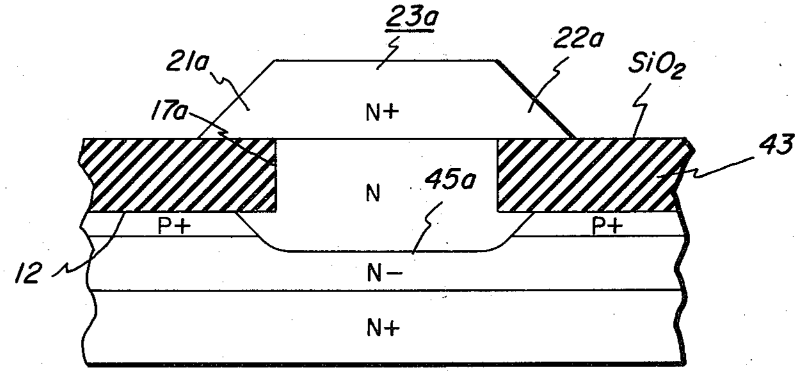

The projections such as projection 17*a* shown in FIG. 3D are epitaxially grown on the second layer and engages the third or diffused layer as well as filling the elongated openings in the oxide layer 43. When the growth reaches the exposed face of the oxide it proceeds laterally along the surface as well as outward. The lateral extent of growth equals substantially the extent of growth from the major surface 12 of the substrate to the exposed surface of the oxide. By selecting the thickness of the oxide the extent of lateral growth of the overhanging portions 21*a* and 22*a* of the projection may be controlled. The projections are made to overhang the elongated surface 13*a*–13*b* regions on the major surface 12 of the substrate and in particular to extend beyond the edges of the elongated openings 44*a*–44*b* etched in the substrate. The hydrogen reduction of silicon tetrachloride process is suitable for growth projections as nucleation occurs only on the silicon and not on the silicon dioxide as lower surface energy is needed for nucleation on silicon. Thus a selective deposition is obtained and of course suitable impurities are introduced in the process to render the epitaxial growth of projection of N-type conductivity. Thereafter the wafer is subjected to a diffusion step in which N-type activators are diffused into the head or upper portions 23*a* and 23*b* of the projections, that is, the portion above the plane of the surface of the oxide 43 to render the upper portions strongly N-type conductivity as they will constitute the source regions of the device.

Figure 3E:
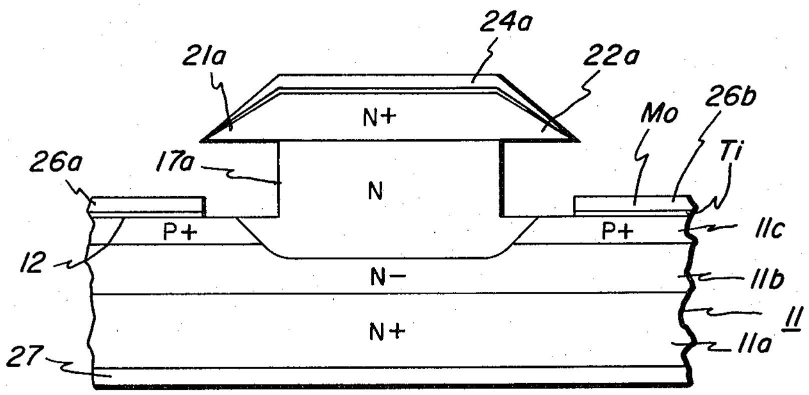

Thereafter, the oxide layer 43 is removed and exposed portions of the projections 17*a* and 17*b* and exposed portions of the elongated regions 16*a*–16*c* of P-type conductivity formed of the diffused layer are provided with metallization as shown in FIG. 3E. Two layers of metallization are provided, one an initial layer of titanium and thereafter a subsequent layer of molybdenum is evaporated onto the exposed surfaces of the projection and the diffused region. For this purpose the wafer or substrate is placed in a metallization chamber, for example, a metal evaporator, in respect to the source of metallization so that the overhanging portions of the projections can shadow mask line of sight of evaporation of metal onto the elongated diffused regions 16*a*–16*c*. Thus the metallization of the device is affected in a single step without the need for any additional masks, and in particular the need for any small geometry masks.

As pointed out in connection with FIGS. 1 and 2, the structure of FIG. 3E then may be covered with a layer of glass, for example, chemically vapor deposited glass, and two rows of holes may be formed in the glass. One row of holes exposes the metal gate electrodes 26*a*–26*c* of the device and the other row of holes exposes the source electrodes 24*a* and 24*b* of the device. Metallization then may be applied over the surface of the glass and into the rows of holes. The metallization, for example, aluminum, is then patterned to form two stripe electrodes, one constituting the gate terminal and the other constituting the source terminal. Metallization 27 is also applied to the exposed surface of the substrate layer 11*a* constituting the drain region and may conveniently be aluminum to constitute the drain terminal.

Figure 4:
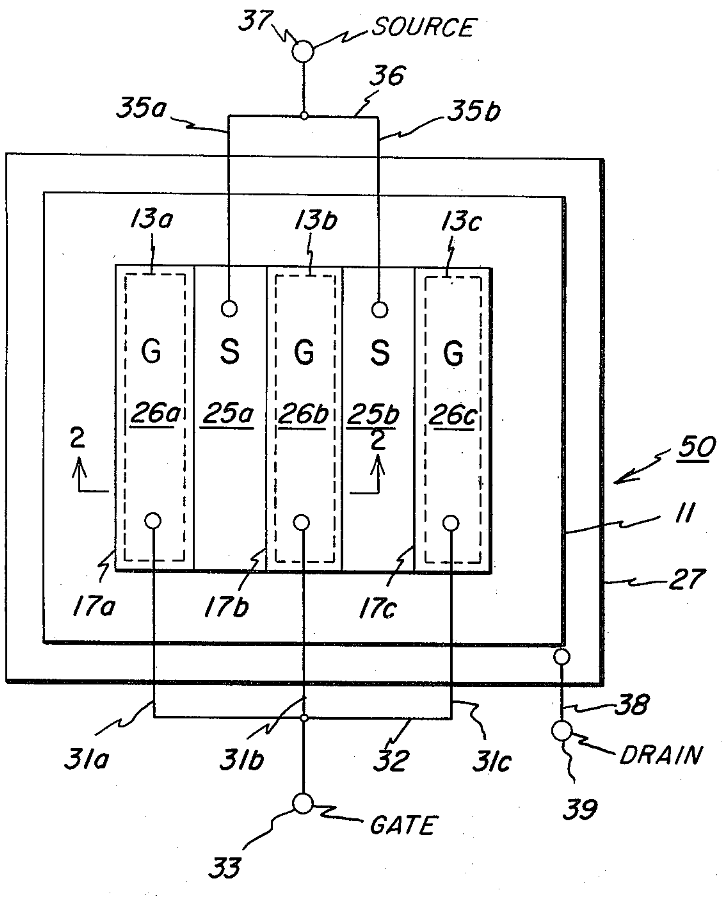
FIG. 4 is a plan view of another embodiment of a field effect semiconductor device in accordance with the present invention.
Figure 5:
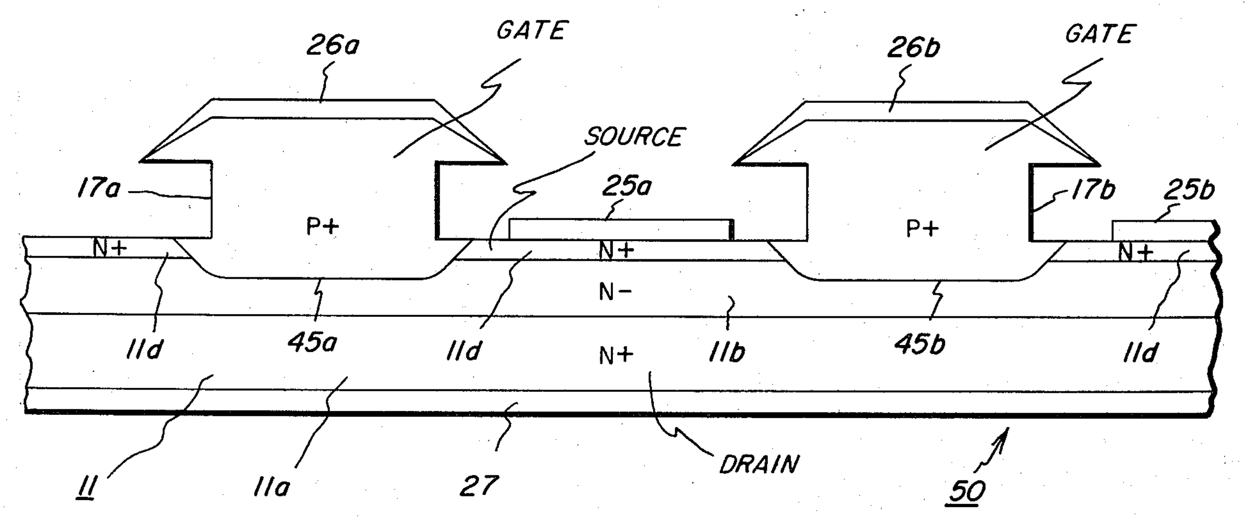
FIG. 5 is a sectional view of the device of FIG. 4 taken along section lines 2—2 showing the internal construction thereof.

Reference is now made to the FIGS. 4 and 5 which show another embodiment of the present invention. Elements of this embodiment identical to elements of the embodiment of FIGS. 1 and 2 are identically designated. The device 50 of FIGS. 4 and 5 is geometrically identical to the device of FIGS. 1 and 2 and is identically formed except with regard to the conductivity type and the net activator or impurity concentration of the various regions thereof. In the device of FIGS. 4 and 5, the third or diffused layer 11*d* is made N-type in conductivity and low resistivity and the elongated regions formed thereby constitute the source regions of the device rather than the gate regions as in FIGS. 1 and 2. Also the epitaxially grown projections 17*a*–17*c* are made P-type conductivity and low resistivity and now constitute the gate regions of the device. The elongated surface regions are designated 13*a*–13*c*. The source electrodes are designated 25*a* and 25*b*, and the gate electrodes are designated 26*a*–26*c*. In other respects, the embodiment of FIGS. 4 and 5 is identical to the embodiment of FIGS. 1 and 2 and except for the alterations required in the process to alter the conductivity types of the diffused layer 11*d* and the projections 17*a*–17*c*, the process is identical to the process for the formation of the devices of FIGS. 1 and 2.

While the invention has been described in an embodiment utilizing silicon semiconductor material, other semiconductor materials such as gallium arsenide or indium phosphide may be used. When such a material as gallium arsenide or indium phosphide is utilized the frequency range of operation of the device could be extended substantially beyond the range of operation of a silicon device, for example, from 3 to 15 gegaHertz.

While the invention has been described in specific embodiments, it will be appreciated that modifications such as described above, may be made by those skilled in the art, and it is intended by the appended claims to cover all such modifications and changes as fall within the true spirit and scope of the invention.

What I claim as new and desire to secure by Letters Patent of the United States is:

1. A field effect transistor comprising a body of semiconductor material including a first layer of a first conductivity type, a second layer of said first conductivity type overlying said first layer, and a third layer of conductivity type opposite to said first conductivity type overlying said second layer, said third layer including an outwardly extending major surface and having an elongated opening exposing an elongated region of said second layer, the resistivity of said second layer being substantially higher than the resistivity of said first and third layers, a projection of semiconductor material of said first conductivity type epitaxially grown on said expose elongated region of said second layer and in the opening of said third layer, said projection extending outward from the exposed surface of said third layer for a predetermined distance and thereafter extending substantially parallel to the exposed surface of said third layer to provide portions which laterally extend beyond the lateral positions of the long edges of the opening provided in said third layer, said projection of said first conductivity type forming a PN junction with said third layer of said second conductivity type, said projection including a first portion initially formed of a resistivity intermediate the resistivities of said first and second layers, and a second portion subsequently formed of a resistivity substantially the same as the resistivity of said first and third layers, each of the exposed portions of said third layer and the outwardly extending face of said projection having a respective conductive layer thereon, said second portion of said projection constituting a source region, said first layer of said body constituting a drain region and said third layer constituting a gate region.

2. The device of claim 1 in which each of the long edges of the conductive layer on said projection and a respective adjacent edge of the conductive layer on said third layer lying in a respective surface substantially orthogonal to said major surface.

3. The device of claim 1 in which the opposed long edges of said elongated opening in said third layer are substantially equally spaced along the length thereof.

4. The device of claim 1 in which said substrate and said projection are constituted of silicon semiconductor material.

5. A field effect transistor comprising a body of semiconductor material including a first layer of a first conductivity type, a second layer of said first conductivity type overlying said first layer, and a third layer of conductivity type opposite to said first conductivity type overlying said second layer, said third layer including an outwardly extending major surface and having a plurality of elongated openings, each exposing a selected elongated region of said second layer, said elongated openings being aligned with adjacent long edges of adjacent openings being uniformly spaced, the resistivity of said second layer being substantially higher than the resistivity of said first and third layers, a plurality of projections of semiconductor material of said first conductivity type, each epitaxially grown on a respective exposed region of said second layer and in a respective opening of said third layer, each of said projections extending outward from the exposed surface of said third layer for a predetermined distance and thereafter extending substantially parallel to the exposed surface of said third layer to provide portions which laterally extend beyond the lateral positions of the long edges of the respective opening provided in said third layer, said projections forming a plurality of PN junctions with said third layer, each of said projections including a first portion initially formed of a resistivity intermediate the resistivities of said first and second layers and a second portion subsequently formed of a resistivity substantially the same as the resistivity of said first and third layers, each of the exposed portions of said third layer and the outwardly extending faces of said projections having a respective conductive layer thereon, said second portions of said projections constituting source regions, said first layer of said body constituting a drain region and said third layer constituting a gate region.

6. A field effect transistor comprising a body of semiconductor material including a first layer of a first conductivity type, a second layer of said first conductivity type overlying said first layer, and a third layer of said first conductivity type overlying said second layer, said third layer including an outwardly extending major surface and having an elongated opening exposing an elongated region of said second layer, the resistivity of said second layer being substantially higher than the resistivity of said first and third layers, a projection of semiconductor material of a second conductivity type opposite to said first conductivity type and of a resistivity substantially the same as the resistivity of said first and third layers epitaxially grown on said exposed elongated region of said second layer and in the opening of said third layer, said projection extending outward from the exposed surface of said third layer for a predetermined distance and thereafter extending substantially parallel to the exposed surface of said third layer to provide portions which laterally extend beyond the lateral positions of the long edges of the opening provided in said third layer, said projection of said second conductivity type forming a PN junction with said second layer of said first conductivity type, each of the exposed portions of said third layer and the outwardly extending face of said projection having a respective conductive layer thereon, said projection constituting a gate region, said first layer of said body constituting a drain region and said third layer constituting a source region.

7. A field effect transistor comprising a body of semiconductor material including a first layer of a first conductivity type, a second layer of said first conductivity type overlying said first layer, and a third layer of said first conductivity type overlying said second layer, said third layer including an outwardly extending major surface and having a plurality of elongated openings, each exposing a selected elongated region of said second layer, said elongated openings being aligned with adjacent long edges of adjacent openings being uniformly spaced, the resistivity of said second layer being substantially higher than the resistivity of said first and third layers, a plurality of projection of semiconductor material of a second conductivity type opposite to said first conductivity type and of a resistivity substantially the same as the resistivity of said first and third layers, each epitaxially grown on a respective exposed region of said second layer and in a respective opening of said third layer, each of said projections extending outward from the exposed surface of said third layer for a predetermined distance and thereafter extending substantially parallel to the exposed surface of said third layer to provide portions which laterally extend beyond the lateral positions of the long edges of the respective opening provided in said third layer, said projections forming a plurality of PN junctions with said second layer, each of the exposed portions of said third layer and the outwardly extending faces of said projections having a respective conductive layer thereon, said projections constituting gate regions, said first layer of said body constituting a drain region and said third layer constituting a source region.

* * * * *